US011205722B2

(12) United States Patent
Lian et al.

(10) Patent No.: US 11,205,722 B2
(45) Date of Patent: Dec. 21, 2021

(54) LATERAL DMOS HAVING REDUCED LATERAL SIZE

(71) Applicant: Chengdu Monolithic Power Systems Co., Ltd., Chengdu (CN)

(72) Inventors: Yanjie Lian, Chengdu (CN); Ji-Hyoung Yoo, Los Gatos, CA (US)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 16/922,157

(22) Filed: Jul. 7, 2020

(65) Prior Publication Data

US 2021/0020779 A1 Jan. 21, 2021

(30) Foreign Application Priority Data

Jul. 17, 2019 (CN) .......................... 201910644870.5

(51) Int. Cl.
*H01L 29/78* (2006.01)
*H01L 29/06* (2006.01)
*H01L 29/40* (2006.01)

(52) U.S. Cl.
CPC ...... *H01L 29/7825* (2013.01); *H01L 29/0649* (2013.01); *H01L 29/407* (2013.01); *H01L 29/7823* (2013.01)

(58) Field of Classification Search
CPC ......... H01L 29/06; H01L 29/10; H01L 29/40; H01L 29/66; H01L 29/78; H01L 29/407; H01L 29/0607; H01L 29/0684; H01L 29/0649; H01L 29/7816; H01L 29/7823; H01L 29/7825; H01L 29/7802; H01L 29/7801; H01L 29/7826; H01L 29/0852; H01L 29/66712; H01L 29/66681; H01L 29/66674; H01L 29/66704; H01L 29/16; H01L 29/18; H01L 29/04; H01L 29/66734; H01L 29/045; H01L 29/1608; H01L 29/185; H01L 29/22; H01L 29/36; H01L 29/2206; H01L 29/365; H01L 29/0856; H01L 29/0869; H01L 29/0873; H01L 29/0886; H01L 29/7813; H01L 29/66689; H01L 29/66719; H01L 29/7815
USPC ....................................................... 257/330
See application file for complete search history.

(56) References Cited

U.S. PATENT DOCUMENTS

2010/0237412 A1* 9/2010 Shrivastava ...... H01L 29/42376
257/336
2016/0181419 A1* 6/2016 Ryu .................... H01L 29/7835
257/343

* cited by examiner

Primary Examiner — Chuong A Luu
(74) Attorney, Agent, or Firm — Perkins Coie LLP

(57) ABSTRACT

A lateral DMOS having a well region, a source region, a drain region, a first gate region and a second gate region. The first gate region may be positioned atop a portion of the well region near the source region side. The second gate region may be formed in a portion of the well region near the drain region side. The second gate region includes a shallow trench isolation structure formed in a shallow trench opened from a top surface of the well region and extended vertically into the well region, and having a first sidewall contacting with the drain region or abut the drain region, and further having a second sidewall opposite to the first sidewall and laterally extended below the first gate region.

18 Claims, 6 Drawing Sheets

LATERAL DMOS HAVING REDUCED LATERAL SIZE

CROSS-REFERENCE TO RELATED APPLICATION(S)

This application claims the benefit of CN application No. 201910644870.5 filed on Jul. 17, 2019 and incorporated herein by reference.

TECHNICAL FIELD

This disclosure relates generally to semiconductor devices, and particularly but not exclusively relates to lateral high voltage transistors.

BACKGROUND

Lateral double diffused metal oxide semiconductor field effect transistors ("Lateral DMOS") are widely used in various power management integrated circuits. It is required in most mobile electronic devices and handheld electronic devices that the field effect transistors have reduced size while maintaining high voltage sustain performance (high breakdown voltage) and low on resistance.

SUMMARY

In accordance with an embodiment of the present disclosure, a lateral DMOS is disclosed. The lateral DMOS may comprise: a semiconductor layer of a first conductivity type; a well region of a second conductivity type opposite to the first conductivity type formed in the semiconductor layer; a source region of the second conductivity type formed in the well region; a drain region of the second conductivity type formed in the well region and separated from the source region; a first gate region positioned atop a portion of the well region near the source region side; and a second gate region formed in a portion of the well region near the drain region side. In accordance with an embodiment, the second gate region may comprise a shallow trench isolation structure formed in a shallow trench opened from a top surface of the well region and extended vertically into the well region. The shallow trench isolation structure may have a first sidewall contacting with the drain region or abut the drain region, and a second sidewall opposite to the first sidewall and laterally extended below the first gate region.

In accordance with an embodiment of the present disclosure, the shallow trench may have a predetermined isolation trench width and a predetermined isolation trench depth.

In accordance with an embodiment of the present disclosure, the shallow trench isolation structure may comprise a liner layer and an insulation filler. The liner layer lines and covers sidewalls and bottom of the shallow trench, and the insulation filler fills the shallow trench.

In accordance with an embodiment of the present disclosure, the second gate region may further comprises a conductive field plate, formed in the shallow trench isolation structure and at least having a field plate portion vertically extended/penetrated into the shallow trench isolation structure.

In accordance with an embodiment of the present disclosure, the lateral DMOS may further comprise an interlayer dielectric layer, formed on the well region and covering the first gate region and the shallow trench isolation structure.

In accordance with an embodiment of the present disclosure, the conductive field plate is formed in the interlayer dielectric layer and the shallow trench isolation structure, vertically extended from a top surface of the interlayer dielectric layer, into and through the interlayer dielectric layer and further extended/penetrated into the shallow trench isolation structure.

In accordance with an embodiment of the present disclosure, the field plate portion extended/penetrated into the shallow trench isolation structure may have a vertical extended depth that is smaller than a predetermined isolation trench depth of the shallow trench.

In accordance with an embodiment of the present disclosure, the conductive field plate may be coupled to the source region.

In accordance with an embodiment of the present disclosure, the conductive field plate may comprise a trenched conductive field plate and may be formed in a field plate trench with a conductive filler filled in the field plate trench.

In accordance with an embodiment of the present disclosure, the conductive field plate may have a bottom side/surface above a bottom side/surface of the shallow trench isolation structure. The bottom side/surface of the conductive field plate may be vertically distanced away from the bottom side/surface of the shallow trench isolation structure with a first predetermined distance.

In accordance with an embodiment of the present disclosure, the conductive field plate may have a first sidewall and a second sidewall opposite to the first sidewall. The first sidewall of the conductive field plate may have a second predetermined distance away from the first sidewall of the shallow trench isolation structure, and the first predetermined distance may be smaller than the second predetermined distance.

In accordance with an embodiment of the present disclosure, the second sidewall of the conductive field plate may have a third predetermined distance away from the second sidewall of the shallow trench isolation structure, and the third predetermined distance may be smaller than the first predetermined distance.

In accordance with an embodiment of the present disclosure, the lateral DMOS may further comprise: a body region of the first conductivity type formed in the well region. For this situation, the source region is formed in the body region and a body contact region may be formed in the body region, contacting with the source region or abut the source region. The body contact region may have the first conductivity type and have a body contact dopant concentration higher than a dopant concentration of the semiconductor layer.

In accordance with an embodiment of the present disclosure, the lateral DMOS may further comprise a first buried layer of the first conductivity type. The first buried layer may be formed in the semiconductor layer and disposed beneath/below the well region, having a first buried layer dopant concentration higher than a dopant concentration of the semiconductor layer.

In accordance with an embodiment of the present disclosure, the lateral DMOS may further comprise a second buried layer of the second conductivity type. The second buried layer may be formed in the semiconductor layer and disposed beneath/below the first buried layer, and having a second buried layer dopant concentration higher than a well dopant concentration of the well region.

In accordance with an embodiment of the present disclosure, the second buried layer may have a predetermined interlayer distance away from the first buried layer in the vertical direction.

In accordance with an embodiment of the present disclosure, the lateral DOMS may optionally comprise the second buried layer with the first buried layer omitted. For this situation, the second buried layer may be formed in the semiconductor layer and buried beneath the well region with a predetermined vertical bury distance away from the bottom surface of the well region in the vertical direction.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features. Likewise, the relative sizes of elements illustrated by the drawings may differ from the relative size depicted.

The use of the same reference label in different drawings indicates the same or like components or structures with substantially the same functions for the sake of simplicity.

DETAILED DESCRIPTION

Various embodiments of the present invention will now be described. In the following description, some specific details, such as example device structures, example manufacturing process and manufacturing steps, and example values for the process, are included to provide a thorough understanding of the embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the terms "left," right," "in," "out," "front," "back," "up," "down, "top," "atop", "bottom," "over," "under," "overlying," "underlying," "above," "below" and the like, if any, are used for descriptive purposes and not necessarily for describing permanent relative positions. It is to be understood that the terms so used are interchangeable under appropriate circumstances such that embodiments of the technology described herein are, for example, capable of operation in other orientations than those illustrated or otherwise described herein. The term "coupled," as used herein, is defined as directly or indirectly connected in an electrical or non-electrical manner to establish an electrical relationship between the elements that are coupled. The terms "a," "an," and "the" includes plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. Those skilled in the art should understand that the meanings of the terms identified above do not necessarily limit the terms, but merely provide illustrative examples for the terms.

Figure 1:
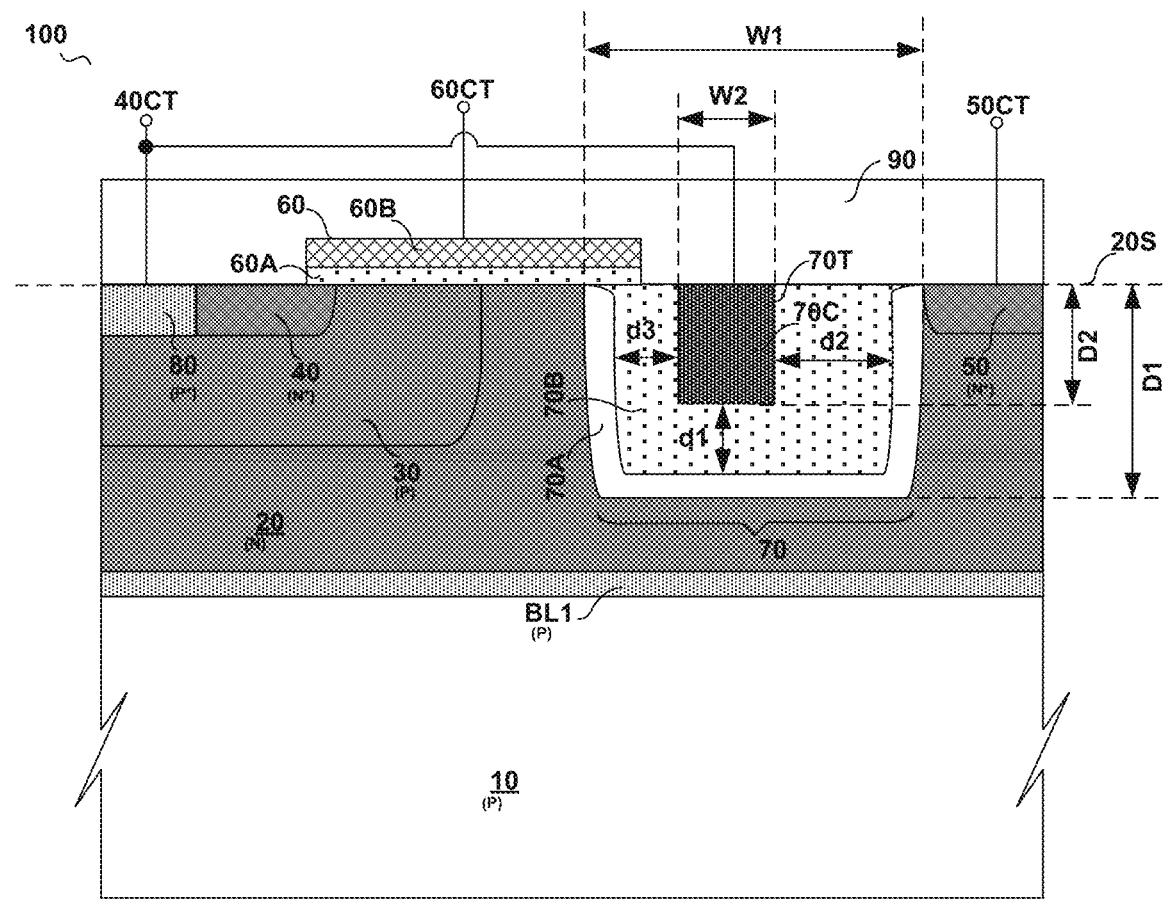
FIG. 1 illustrates a cross-sectional view of a lateral double diffused metal oxide semiconductor field effect transistor ("DMOS") 100 in accordance with an embodiment of the present invention.

FIG. 1 illustrates a cross-sectional view of a lateral DMOS 100 in accordance with an embodiment of the present invention. The cross-section is cut from a plane defined by the x and y axis. Throughout this disclosure, lateral refers to a direction parallel to the x axis while vertical refers to a direction parallel to the y axis. The lateral DMOS 100 may comprise a semiconductor layer 10 of a first conductivity type (e.g. P-type in FIG. 1); a well region 20 of a second conductivity type (e.g. N-type in FIG. 1) opposite to the first conductivity type, formed in the semiconductor layer 10 and having a well dopant concentration; a body region 30 of the first conductivity type formed in the well region 20; a source region 40 of the second conductivity type (e.g. illustrated as an $N^+$ region in FIG. 1) formed in the body region 30 and having a source dopant concentration that is higher than the well dopant concentration; a drain region 50 of the second conductivity type (e.g. illustrated as another $N^+$ region in FIG. 1) formed in the well region 20 and having a drain dopant concentration that is higher than the well dopant concentration; and a first gate region 60, positioned atop a portion of the well region 20 near the source region 40 side. The first gate region 60 may comprise a gate dielectric layer 60A and a gate conductive layer 60B positioned atop the gate dielectric layer 60A.

In accordance with an embodiment of the present invention, the lateral DMOS 100 may further comprise a second gate region 70, formed in a portion of the well region 20 near the drain region 50 side. The second gate region 70 may comprise a shallow trench isolation structure (70A, 70B). The shallow trench isolation structure (70A, 70B) may be formed in a shallow trench opened from a top surface 20S of the well region 20 and extended vertically into the well region 20 with a predetermined isolation trench width W1 and a predetermined isolation trench depth D1. The shallow trench has sidewalls (including a first sidewall near the drain region 50 and a second sidewall opposite to the first sidewall) and bottom. In accordance with an embodiment, the shallow trench may be formed by an etching process or a laser direct imaging and develop process or any other suitable process to form such a shallow trench in the well region 20. The shallow trench isolation structure (70A, 70B) therefore may have a first sidewall contacting with the drain region 50 or abut the drain region 50 (e.g. the first sidewall may be laterally separated from the drain region 50 by a portion of the well region 20). The shallow trench isolation structure (70A, 70B) may further have a second sidewall opposite to the first sidewall, wherein the second sidewall laterally extends below the first gate region 60 (i.e. the second sidewall is positioned below the first gate region 60). The shallow trench isolation structure (70A, 70B) may comprise a liner layer 70A and an insulation filler 70B. The liner layer 70A may line and cover sidewalls (including the first sidewall and the second sidewall) and bottom of the shallow trench, and may be formed by growing a thermal oxide layer and/or depositing a nitride layer. The liner layer 70A may help to cure defects that have occurred during the process of forming the shallow trench, and to prevent stress and a trap center from being generated between the liner layer 70A and the well region 20. The shallow trench lined with the liner layer 70A is then filled with the insulation filler 70B. The insulation filler 70B may comprise an oxide layer, which may be formed of, for example, an oxide layer group such as SOG (Spin On Glass), USG (Undoped Silicate Glass), BPSG (Boron Phosphorus Silicate Glass), PSG (Phosphor Silicate Glass), PETEOS (Plasma Enhanced Tetra Ethryl Ortho Silicate) and flowable oxide material, or can be formed of a multilayer containing two or more from the oxide layer group. The oxide layer group may be formed through a CVD (chemical vapor deposition), a reflow system and a deposition using high density plasma (HDP) equipment, for example. Compared with conventional lateral DMOS having a thick field oxide layer formed atop the well region 20, the lateral DMOS 100 with the shallow trench isolation structure (70A, 70B) formed into the well region 20 instead may have reduced lateral size and reduced specific on resistance (i.e. the product of an on-resistance Ron of the lateral DMOS 100 and its area A, generally denoted by $R_{on}*A$) while retaining the same breakdown voltage. When applied in an integrated circuit as a switching device, the lateral DMOS 100 may advantageously help to improve the high voltage sustain capability and operation robustness while reducing the die size of the integrated circuit.

In accordance with an embodiment of the present invention, the second gate region 70 may further comprise a conductive field plate 70C formed in the shallow trench isolation structure (70A, 70B). The conductive field plate 70C may at least partially (e.g. have a field plate portion) vertically extended/penetrated into the shallow trench isolation structure (70A, 70B). The field plate portion, which is extended/penetrated into the shallow trench isolation structure (70A, 70B), has a vertical extended depth D2 that is smaller than the isolation trench depth D1 and a lateral maximum width W2 that is smaller than the isolation trench width W1. The conductive field plate 70C may comprise a conductive layer, which may be formed of, for example, a conductive material from a conductive material group such as Tungsten (W), Titanium (Ti), Cobalt (Co), and other metal, alloy and highly doped polysilicon etc., or can be formed of a multi conductive layer containing two or more from the conductive material group. The conductive field plate 70C may advantageously help to capacitively deplete the well region 20. Therefore, the lateral DMOS 100 may allow the well region 20 to have an increased well dopant concentration than would be possible without the conductive field plate 70C, thereby further reducing the on-resistance while retaining the breakdown voltage of the lateral DMOS 100. The conductive field plate 70C in accordance with an exemplary embodiment may be coupled to the source region 30 to help to establish a uniform electric field distribution in the well region 20, alleviating the formation of high electric field locations in the well region 20, thereby improving the breakdown voltage of the lateral DMOS 100. In addition, since the conductive field plate 70C at least partially (having the field plate portion) vertically extended into the shallow trench isolation structure (70A, 70B), the second gate region 70 may advantageously help to sustain a higher drain to gate voltage than would be possible without the second gate region 70, thereby protecting the first gate region 60 from being damaged by high drain to gate voltage. The drain to gate voltage may refer to a voltage drop between the drain region 50 and the first gate region 60.

In accordance with various embodiments of the present invention, the first gate region 60 and the second gate region 70 of the lateral DMOS 100 are separated from each other because the conductive field plate 70C of the second gate region 70 is separated and electrically isolated from the gate conductive layer 60B of the first gate region 60. Therefore, the lateral DMOS 100 may have a reduced drain to gate capacitance that is lower than would be possible without the second gate region 70. Drain to gate capacitance may refer to an equivalent capacitance between the drain region 50 and the first gate region 60. Accordingly, the lateral DMOS 100 may allow a higher on and off switching rate and thereby advantageously improving the maximum switching frequency that an integrated circuit using the lateral DMOS 100 as a switching device can be operated at. An integrated circuit with higher operating switching frequency may advantageously have higher efficiency and reduced die size.

In accordance with an embodiment of the present invention, the conductive field plate 70C may comprise a trenched conductive field plate and may be formed in a field plate trench 70T with a conductive filler (also labeled with 70C for simplicity) formed of one or more conductive materials (for instance from the conductive material group such as Tungsten (W), Titanium (Ti), Cobalt (Co), and other metal, alloy and highly doped polysilicon etc.) filled in the field plate trench 70T. The conductive filler 70C may fully or partially fill in the field plate trench 70T. For instance, in the exemplary embodiment of FIG. 1, it is illustrated that the conductive filler 70C fully fill in (or fill up) the filed plate trench 70T. The field plate trench 70T or the conductive field plate 70C may have a bottom side/surface which has a first predetermined distance d1 away from the bottom side/surface of the shallow trench isolation structure (70A, 70B), a first sidewall having a second predetermined distance d2 away from the first sidewall of the shallow trench isolation structure (70A, 70B), and a second sidewall having a third predetermined distance d3 away from the second sidewall of the shallow trench isolation structure (70A, 70B). The second sidewall of the field plate trench 70T (or the trenched conductive field plate 70C) is opposite to the first sidewall of the field plate trench 70T (or the trenched conductive field plate 70C). The first predetermined distance d1, the second predetermined distance d2 and the third predetermined distance d3 may be appropriately designed or determined according to practical applications requirements to breakdown voltage/voltage sustain performance, on resistance (Ron) and size etc. to the lateral DMOS 100 to optimize electrical characteristics of the lateral DMOS 100.

In an embodiment for instance, the first predetermined distance d1 may be smaller than the second predetermined distance d2, i.e. d1<d2. In an embodiment for instance, the third predetermined distance d3 may be smaller than the first predetermined distance d1, i.e. d3<d1. Through appropriately setting the first predetermined distance d1, the second predetermined distance d2 and the third predetermined distance d3, the lateral DMOS 100 may have improved breakdown voltage/voltage sustain performance while permitting the well region 20 to be doped with a higher well dopant concentration to further reduce the on resistance Ron. Meanwhile, the lateral size of a portion of the well region 20 which is laterally located between the drain region 50 and the first gate region 60 can be reduced and thereby further reducing the size and the specific on resistance Ron*A of the lateral DMOS 100. The portion of the well region 20 which is laterally located between the drain region 50 and the first gate region 60 may generally be referred to as a drift region of the lateral DMOS 100. In accordance with various embodiments of the present invention, the first predetermined distance d1, the second predetermined distance d2 and the third predetermined distance d3 may respectively be set and chosen from a different set of distance ranges to meet different specifications in the breakdown voltage of the lateral DMOS 100. For instance, to meet the specification of a 60V breakdown voltage, the first predetermined distance d1 may be chosen from a distance range of 0.15 μm to 0.35 μm, the second predetermined distance d2 may be chosen from a distance range of 0.5 μm to 2 μm, and the third predetermined distance d3 may be chosen from a distance range of 0.05 μm to 0.2 μm. One of ordinary skill in the art should understand that the set of distance ranges are given just as examples for helping to better understand embodiments of the present invention and are not intended to be limiting.

In accordance with an exemplary embodiment of the present invention, still referring to FIG. 1, the lateral DMOS 100 may further comprise a body contact region 80, formed in the body region 30 and contacting with the source region 40 or abut the source region 40. The body contact region 80 may have the first conductivity type and have a body contact dopant concentration which may be higher than for example a dopant concentration of the semiconductor layer 10. The body contact region 80 is illustrated as a $P^+$ region in the example of FIG. 1. In accordance with an embodiment, the body contact region 80 may contact with the source region 40 and may be coupled to a source contact 40CT (the source contact 40CT is exemplarily illustrated out with a wire in FIG. 1 for simplicity). The body contact region 80 may help to advantageously improve electrical connection performance from the source region 40 to the well region 20.

In accordance with an exemplary embodiment of the present invention, still referring to FIG. 1, the lateral DMOS 100 may further comprise an interlayer dielectric layer 90, formed on the well region 20 and covering/shielding the first gate region 60 and the shallow trench isolation structure (70A, 70B). The source contact 40CT, a drain contact 50CT and a gate contact 60CT may be formed atop the interlayer dielectric layer 90 and may respectively be coupled to the source region 40, the drain region 50 and the first gate region 60 through vias formed in the interlayer dielectric layer 90. In the example of FIG. 1, respective electrical coupling from the source contact 40CT, the drain contact 50CT and the gate contact 60CT to the corresponding source region 40, the corresponding drain region 50 and the corresponding first gate region 60 are exemplarily illustrated out with corresponding wires for simplicity. In an exemplary embodiment, the conductive field plate 70C may be coupled to the source region 40 or to the source contact 40CT and such coupling is exemplarily illustrated out with a wire in FIG. 1 for simplicity. One of ordinary skill in the art would understand that in practical the couplings may be implemented with conductive traces formed from metal or alloy and will not be addressed herein.

Figure 2:
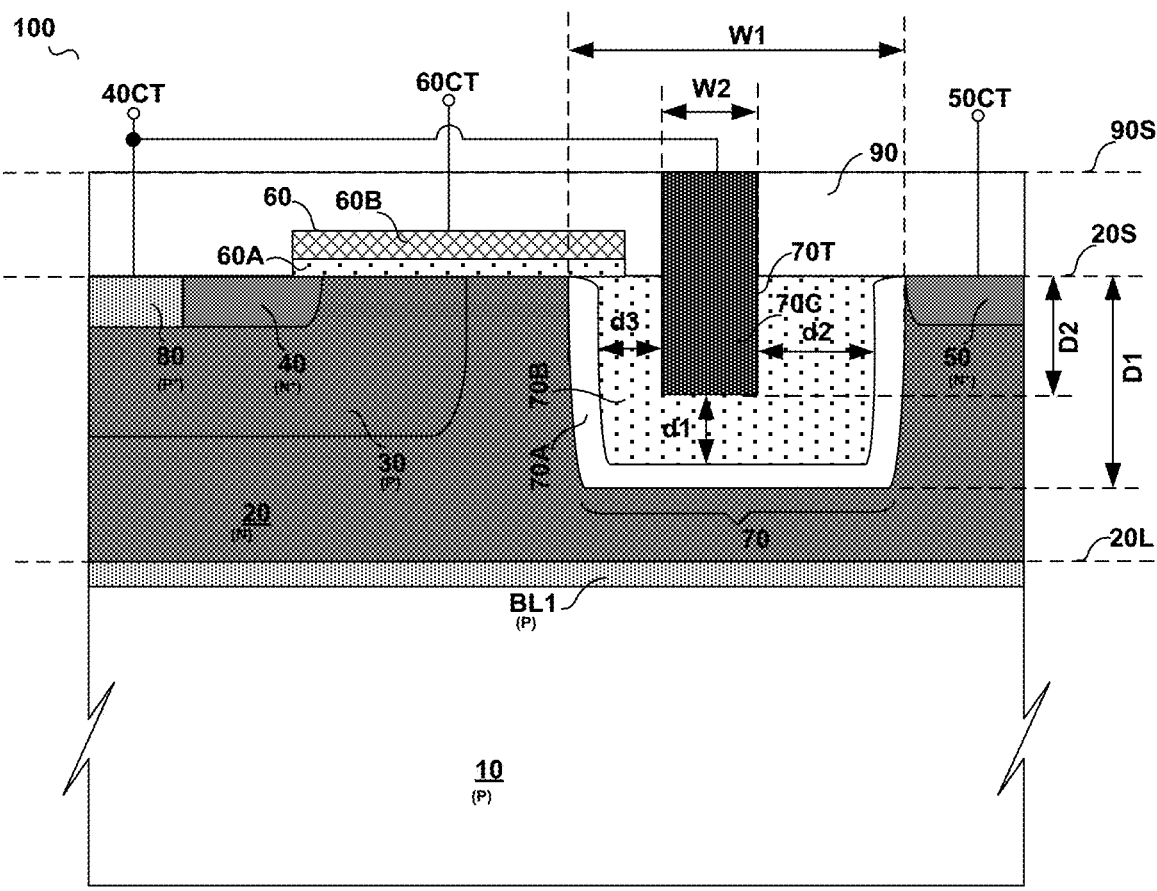
FIG. 2 illustrates a cross-sectional view of a lateral DMOS 100 in accordance with an alternative embodiment of the present invention.

In accordance with an alternative embodiment of the present invention as illustrated in FIG. 2, the conductive field plate 70C may optionally be formed in the interlayer dielectric layer 90 and the shallow trench isolation structure (70A, 70B), vertically extended from a top surface 90S of the interlayer dielectric layer 90, into and through the interlayer dielectric layer 90 and further extended/penetrated into the shallow trench isolation structure (70A, 70B). Similar to the embodiment of FIG. 1, the conductive field plate 70C in the embodiment of FIG. 2 may at least have a field plate portion vertically extended/penetrated into the shallow trench isolation structure (70A, 70B). The field plate portion, which is extended/penetrated into the shallow trench isolation structure (70A, 70B), has a vertical extended depth D2 that is smaller than the isolation trench depth D1. Difference of the lateral DMOS 100 in FIG. 2 from the lateral DMOS 100 in FIG. 1 generally lies in that the conductive field plate 70C of the lateral DMOS 100 in FIG. 2 extends vertically from the top surface 90S of the interlayer dielectric layer 90 down into the shallow trench isolation structure (70A, 70B) instead of extending from the top surface 20S of the well region 20. This may advantageously help to save fabrication processes and cost for forming the conductive field plate 70C in that at least a mask layer, a photolithography process, an etching process and a trench filling process may be saved. For instance, to fabricate the lateral DMOS 100 illustrated in the exemplary embodiment of FIG. 1, after formation of the shallow trench isolation structure (70A, 70B), a dedicated mask layer may be applied with at least a photolithography process, a trench etching process and a trench filling process being performed subsequently to form the conductive field plate 70C. For the lateral DMOS 100 illustrated in the exemplary embodiment of FIG. 2, the conductive field plate 70C may be fabricated sharing at least partial of the processes (e.g. a mask layer formation process, a photolithography process, an etching process and a filling process etc.) for fabricating the vias in the interlayer dielectric layer 90, the source contact 40CT, the drain contact 50CT and the gate contact 60CT. It would be easy for those of ordinary skill in the art to understand and not be addressed in more details herein.

The structures of the lateral DMOS 100 shown in FIG. 1 and FIG. 2 are just described as examples for helping to better understand embodiments of the present invention and are not intended to be limiting. In accordance with various embodiments of the present invention, the semiconductor layer 101 may be provided and formed on other layers (not shown in FIG. 1) that are compatible with various features of various embodiments of the lateral DMOS 100 and are compatible with other aspects of the device manufacturing process. For example, in one embodiment, the semiconductor layer 101 may comprise a semiconductor substrate of the first conductivity type; in other embodiment, the semiconductor layer 101 may be provided and formed on a semiconductor substrate of the first conductivity type; in other embodiment, the semiconductor layer 101 may be provided on an epitaxial layer of the first conductivity type which may be formed on a semiconductor substrate of the first conductivity type; in still other embodiment, the semiconductor layer 101 may even be provided and formed on a silicon dioxide (SOI) layer which may be formed on a semiconductor substrate of the second conductivity type. Various embodiments of the present invention intend to cover any equivalent modifications and variations wherein the semiconductor layer 101 is provided and the lateral DMOS 100 is manufactured in/on the semiconductor layer 101.

In accordance with an embodiment of the present invention, as illustrated in FIG. 1 and FIG. 2, the lateral DMOS 100 may further comprise a first buried layer BL1, formed in the semiconductor layer 101. The first buried layer BL1 may be disposed beneath/below the well region 20 and may have the first conductivity type (e.g. illustrated as a P type buried layer in FIG. 1 and FIG. 2). The first buried layer BL1 may have a first buried layer dopant concentration higher than a dopant concentration of the semiconductor layer 101. The first buried layer BL1 may function as a buried reduced surface field (RESURF) layer and may help to increase the breakdown voltage of the lateral DMOS 100. Meanwhile, the first buried layer BL1 may help to deplete a first portion of the well region 20 located above the first buried layer BL1, allowing the first portion of the well region 20 to be doped with a much higher dopant concentration than would be possible without the first buried layer BL1, thereby further reducing the on-resistance while improving or at least without lowering the breakdown voltage.

Figure 3:
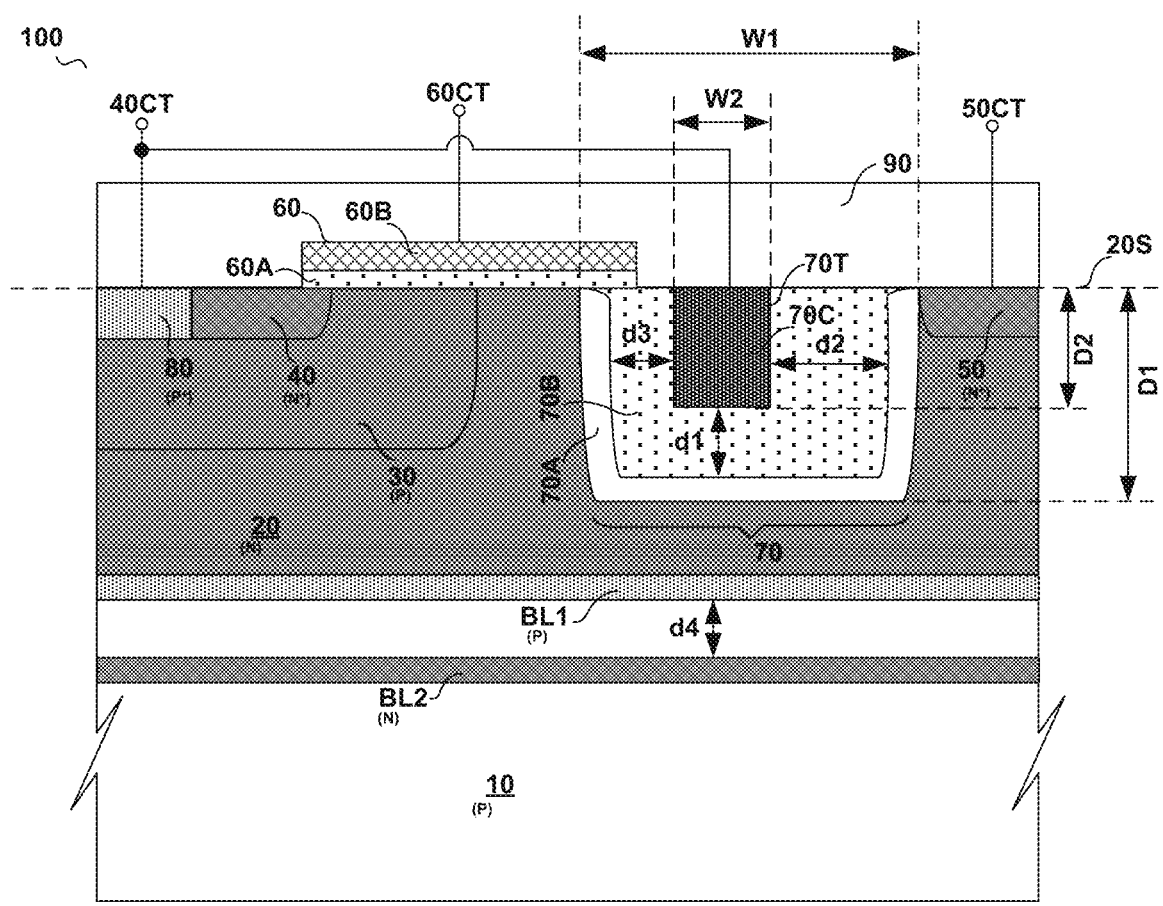
FIG. 3 illustrates a cross-sectional view of a lateral DMOS 100 in accordance with an alternative embodiment of the present invention.
Figure 4:
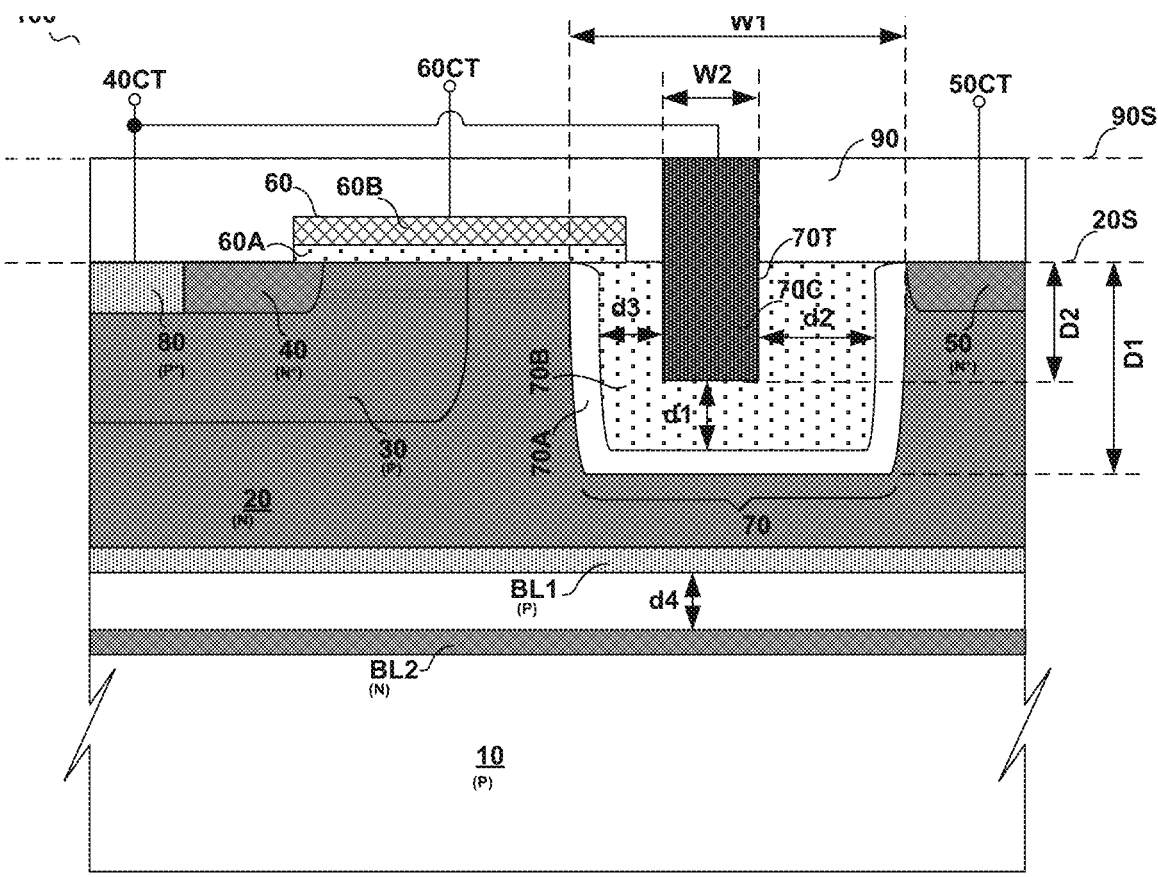
FIG. 4 illustrates a cross-sectional view of a lateral DMOS 100 in accordance with an alternative embodiment of the present invention.

In accordance with an alternative embodiment of the present invention, as illustrated in FIG. 3 and FIG. 4, the lateral DMOS 100 may further comprise a second buried layer BL2, formed in the semiconductor layer 101. The second buried layer BL2 may be disposed beneath/below the first buried layer BL1 and may have the second conductivity type (e.g. illustrated as an N type buried layer in FIG. 3 and FIG. 4). The second buried layer BL2 may have a second buried layer dopant concentration higher than the well dopant concentration of the well region 20. The second buried layer BL2 may help to prevent carrier injections from the well region 20 to the semiconductor layer 10. The second buried layer BL2 may also provide potential isolation between the semiconductor layer 10 and the well region 20. The second buried layer BL2 may have a predetermined interlayer distance d4 away from the first buried layer BL1 in the vertical direction. The predetermined interlayer distance d4 may be appropriately chosen/set according to practical application requirements to the breakdown voltage/voltage sustain performance of the lateral DMOS 100. For instance, setting a greater predetermined interlayer distance d4 may help to support a higher breakdown voltage/voltage sustain performance of the lateral DMOS 100.

Figure 5:
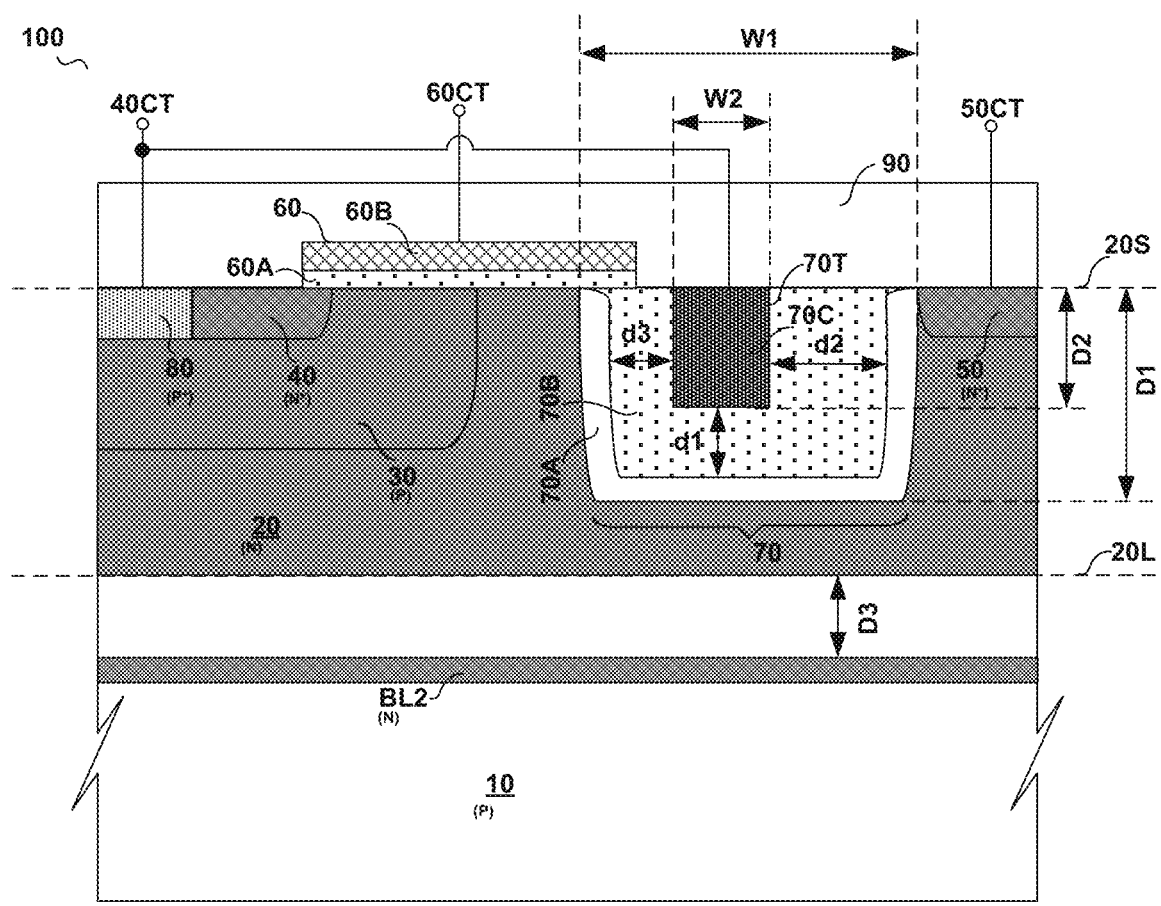
FIG. 5 illustrates a cross-sectional view of a lateral DMOS 100 in accordance with an alternative embodiment of the present invention.
Figure 6:
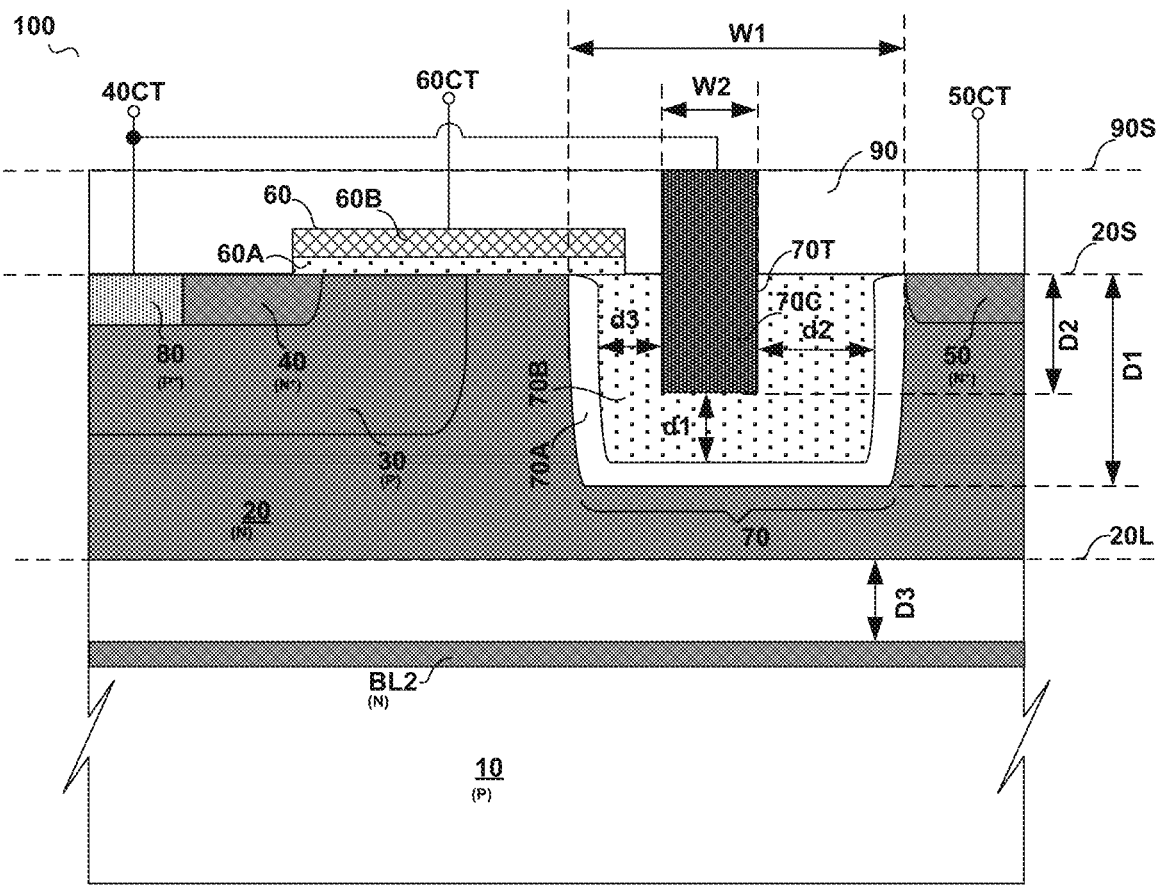
FIG. 6 illustrates a cross-sectional view of a lateral DMOS 100 in accordance with an alternative embodiment of the present invention.

In accordance with an alternative embodiment of the present invention, as illustrated in FIG. 5 and FIG. 6, the lateral DOMS 100 may optionally comprise the second buried layer BL2 with the first buried layer BL1 omitted. For this situation, the second buried layer BL2 may be formed in the semiconductor layer 101 and buried beneath the well region 20 with a predetermined vertical bury distance D3 away from the bottom surface 20L of the well region 20 in the vertical direction.

Although lateral DMOS are illustrated and explained based on an N channel lateral DMOS according to various embodiments of the present invention, this is not intended to be limiting. Persons of ordinary skill in the art will understand that the processes, structures and principles taught herein may apply to other types of semiconductor devices such as a P channel lateral DMOS or any other suitable semiconductor structures/devices having the shallow trench isolation structure (70A, 70B) or the second gate region 70.

From the foregoing, it will be appreciated that specific embodiments of the present invention have been described herein for purposes of illustration, but that various modifications may be made without deviating from the invention. Many of the elements of one embodiment may be combined with other embodiments in addition to or in lieu of the elements of the other embodiments. Accordingly, the present invention is not limited except as by the appended claims.

We claim:

1. A lateral DMOS, comprising:
   a semiconductor layer of a first conductivity type;
   a well region of a second conductivity type opposite to the first conductivity type formed in the semiconductor layer;
   a source region of the second conductivity type formed in the well region;
   a drain region of the second conductivity type formed in the well region and separated from the source region;
   a first gate region positioned atop a portion of the well region near the source region side; and
   a second gate region formed in a portion of the well region near the drain region side, the second gate region comprising a shallow trench isolation structure formed in a shallow trench opened from a top surface of the well region and extended vertically into the well region, wherein the shallow trench isolation structure has a first sidewall contacting with the drain region or abut the drain region, and a second sidewall opposite to the first sidewall and laterally extended below the first gate region, and wherein the shallow trench isolation structure further comprises a liner layer and an insulation filler, and wherein the liner layer lines and covers sidewalls and bottom of the shallow trench, and wherein the insulation filler fills the shallow trench.

2. The lateral DMOS of claim 1, wherein the shallow trench has a predetermined isolation trench width and a predetermined isolation trench depth.

3. The lateral DMOS of claim 1, further comprising:
   an interlayer dielectric layer, formed on the well region and covering the first gate region and the shallow trench isolation structure.

4. The lateral DMOS of claim 1, wherein the second gate region further comprises:
   a conductive field plate, formed in the shallow trench isolation structure and at least having a field plate portion vertically extended/penetrated into the shallow trench isolation structure.

5. The lateral DMOS of claim 4, further comprising:
   an interlayer dielectric layer, formed on the well region and covering the first gate region and the shallow trench isolation structure.

6. The lateral DMOS of claim 5, wherein the conductive field plate is formed in the interlayer dielectric layer and the shallow trench isolation structure, vertically extended from a top surface of the interlayer dielectric layer, into and through the interlayer dielectric layer and further extended/penetrated into the shallow trench isolation structure.

7. The lateral DMOS of claim 4, wherein the field plate portion has a vertical extended depth that is smaller than a predetermined isolation trench depth of the shallow trench.

8. The lateral DMOS of claim 4, wherein the conductive field plate is coupled to the source region.

9. The lateral DMOS of claim 4, wherein the conductive field plate comprises a trenched conductive field plate and is formed in a field plate trench with a conductive filler.

10. The lateral DMOS of claim 4, wherein the conductive field plate has a bottom side/surface above a bottom side/surface of the shallow trench isolation structure, and wherein the bottom side/surface of the conductive field plate is vertically distanced away from the bottom side/surface of the shallow trench isolation structure with a first predetermined distance.

11. The lateral DMOS of claim 10, wherein the conductive field plate has a first sidewall and a second sidewall opposite to the first sidewall, and wherein the first sidewall of the conductive field plate has a second predetermined distance away from the first sidewall of the shallow trench isolation structure, and wherein the first predetermined distance is smaller than the second predetermined distance.

12. The lateral DMOS of claim 11, wherein the second sidewall of the conductive field plate has a third predetermined distance away from the second sidewall of the shallow trench isolation structure, and wherein the third predetermined distance is smaller than the first predetermined distance.

13. The lateral DMOS of claim 1, further comprising:
   a body region of the first conductivity type formed in the well region, and wherein the source region is formed in the body region; and
   a body contact region, formed in the body region and contacting with the source region or abut the source region, and wherein the body contact region has the first conductivity type and has a body contact dopant concentration higher than a dopant concentration of the semiconductor layer.

14. The lateral DMOS of claim 1, further comprising:
a first buried layer of the first conductivity type, formed in the semiconductor layer and disposed beneath/below the well region, and having a first buried layer dopant concentration higher than a dopant concentration of the semiconductor layer.

15. The lateral DMOS of claim 13, further comprising:
a second buried layer of the second conductivity type, formed in the semiconductor layer and disposed beneath/below the first buried layer, and having a second buried layer dopant concentration higher than a well dopant concentration of the well region.

16. The lateral DMOS of claim 14, wherein the second buried layer has a predetermined interlayer distance away from the first buried layer in the vertical direction.

17. The lateral DMOS of claim 1, further comprising:
a buried layer of the second conductivity type, formed in the semiconductor layer and disposed beneath/below the well region, and having a buried layer dopant concentration higher than a well dopant concentration of the well region.

18. The lateral DMOS of claim 17, wherein the buried layer has a predetermined vertical bury distance away from the bottom surface of the well region in the vertical direction.

* * * * *